United States Patent
Tsumura et al.

(10) Patent No.: US 11,768,226 B2
(45) Date of Patent: Sep. 26, 2023

(54) INSPECTION JIG AND INSPECTION APPARATUS

(71) Applicant: NIDEC READ CORPORATION, Kyoto (JP)

(72) Inventors: Kohei Tsumura, Kyoto (JP); Takanori Furukawa, Kyoto (JP); Jyun Yamanouchi, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 0 days.

(21) Appl. No.: 17/386,567

(22) Filed: Jul. 28, 2021

(65) Prior Publication Data
US 2022/0034938 A1  Feb. 3, 2022

(30) Foreign Application Priority Data

Jul. 31, 2020  (JP) ................. 2020-131147

(51) Int. Cl.
*G01R 1/04* (2006.01)
*G01R 1/067* (2006.01)
*G01R 1/073* (2006.01)
*G01R 31/28* (2006.01)

(52) U.S. Cl.
CPC ..... *G01R 1/07314* (2013.01); *G01R 31/2886* (2013.01); *G01R 31/2896* (2013.01)

(58) Field of Classification Search
CPC .......... G01R 1/04; G01R 1/067; G01R 1/073; G01R 1/07314; G01R 31/04; G01R 31/046; G01R 31/28; G01R 31/2886; G01R 31/2896
See application file for complete search history.

(56) References Cited

U.S. PATENT DOCUMENTS

| | | | | |
|---|---|---|---|---|
| 10,859,599 B2* | 12/2020 | Hayashizaki | ...... | G01R 1/06761 |
| 2005/0151547 A1* | 7/2005 | Machida | ............ | G01R 1/07371 |
| | | | | 324/754.03 |
| 2010/0304625 A1* | 12/2010 | Nakamura | ......... | G01R 1/07342 |
| | | | | 439/876 |

FOREIGN PATENT DOCUMENTS

| | | | |
|---|---|---|---|
| JP | 2008241808 | * | 10/2008 |
| JP | 2012103125 A | | 5/2012 |

* cited by examiner

*Primary Examiner* — Neel D Shah
(74) *Attorney, Agent, or Firm* — VIERING, JENTSCHURA & PARTNER MBB

(57) ABSTRACT

Provided are an inspection jig and an inspection apparatus in which a configuration for bending a plurality of contacts in the same direction can be simplified. The inspection jig includes a plurality of contacts each of which has a rod shape, a first support portion that supports the first end portion side of the plurality of contacts, and a second support portion that supports the second end portion side of the plurality of contacts. The first support portion includes a facing support plate that is disposed to face the second support portion in a manner separated from the second support portion and has a plurality of through holes through which the plurality of contacts are inserted, and a cross section of each of the through holes has an elliptical shape whose major axis extends in a predetermined specific direction along a plane direction of the facing support plate.

19 Claims, 15 Drawing Sheets

INSPECTION JIG AND INSPECTION APPARATUS

CROSS-REFERENCE TO RELATED APPLICATIONS

The present application claims priority under 35 U.S.C. § 119 to Japanese Patent Application No. 2020-131147 filed on Jul. 31, 2020, the entire content of which is incorporated herein by reference.

TECHNICAL FIELD

Various embodiments of the present disclosure relate to an inspection jig including a contact and an inspection apparatus using the inspection jig.

BACKGROUND

Conventionally, there has been known a probe card including a support member having an upper support hole and a lower support hole that respectively position and support an upper portion and a lower portion of a wire probe, and a flexible guide film that supports an intermediate portion of the wire probe by bending the intermediate portion in one direction. The lower support hole of the support member is formed in a first bottom plate and a second bottom plate that are stacked.

Conventionally, in addition to the support member that positions and supports the upper portion and the lower portion of the wire probe, a guide film that supports an intermediate portion of the wire probe by bending the intermediate portion in one direction.

SUMMARY

The inspection jig according to an example of the present disclosure includes a plurality of contacts each of which has a rod shape, a first support portion that supports a first end portion side of the plurality of contacts, and a second support portion that supports a second end portion side of the plurality of contacts. The first support portion includes a facing support plate that is disposed to face the second support portion in a manner separated from the second support portion and has a plurality of through holes through which the plurality of contacts are inserted, and a cross section of each of the through holes has an elliptical shape whose major axis extends in a predetermined specific direction along a plane direction of the facing support plate.

Further, the inspection jig according to an example of the present disclosure includes a plurality of contacts each of which has a rod shape, a first support portion that supports the first end portion side of the plurality of contacts, and a second support portion that supports the second end portion side of the plurality of contacts. The first support portion includes a facing support plate that is disposed to face the second support portion in a manner separated from the second support portion and has a plurality of through holes through which the plurality of contacts are inserted, a cross section of each of the through holes has a shape elongated in a predetermined specific direction along a plane direction of the facing support plate, and an inner wall on one end side in the specific direction of each of the through holes and a contact inserted through each of the through holes are in contact with each other at two points or two lines.

An inspection apparatus according to an example of the present disclosure includes the inspection jig described above and an inspection processing unit that inspects an inspection object based on an electric signal obtained by bringing the contact into contact with an inspection point provided on the inspection object.

The above and other elements, features, steps, characteristics and advantages of the present disclosure will become more apparent from the following detailed description of the preferred embodiments with reference to the attached drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
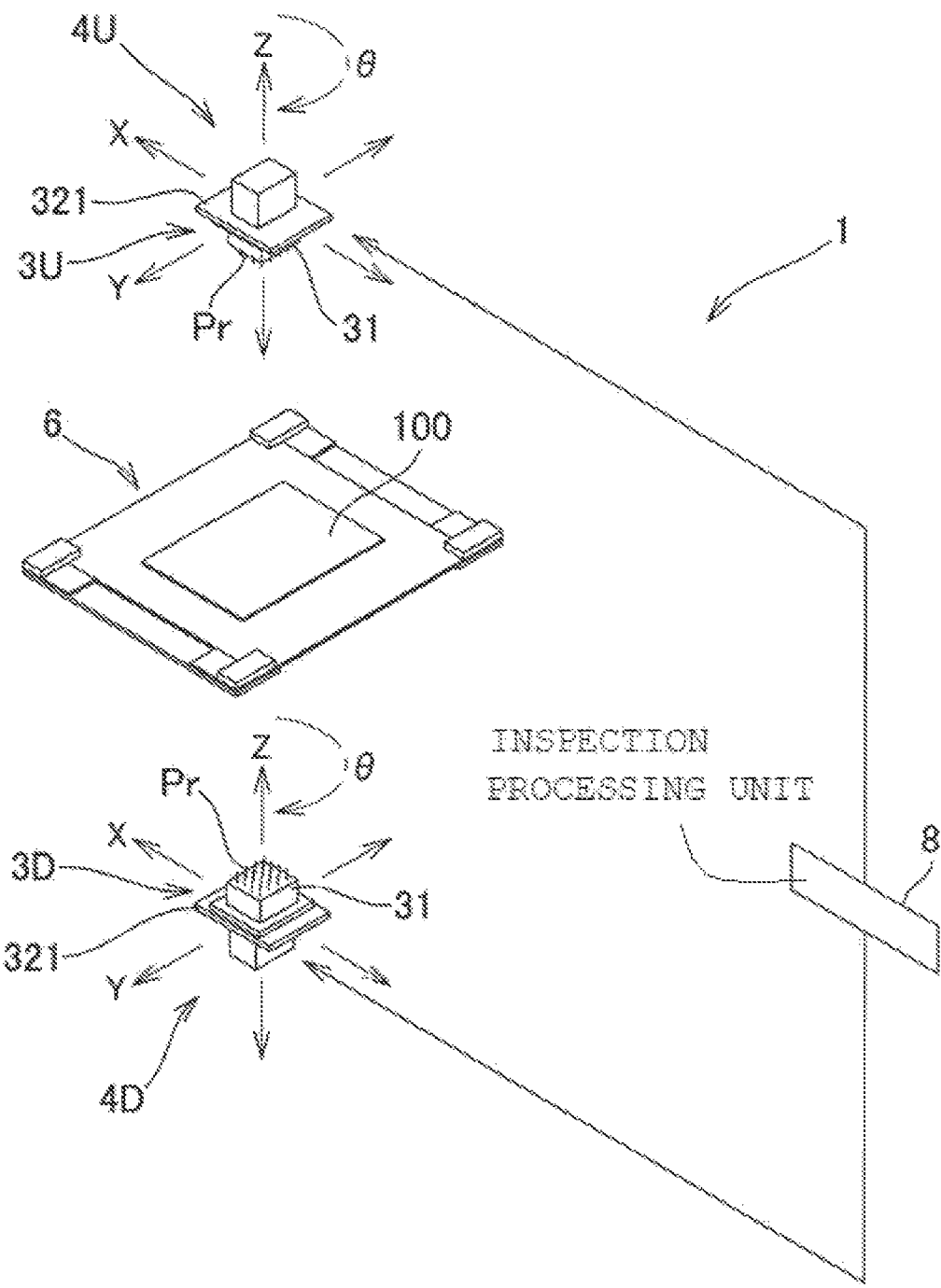
FIG. 1 is a conceptual diagram schematically illustrating an example of a configuration of an inspection apparatus 1 using an inspection jig 3 according to an embodiment of the present disclosure.

Hereinafter, an embodiment according to the present disclosure will be described with reference to the drawings. In the drawings, configurations indicated by the same reference numerals denote the same configurations, and description of such configurations will be omitted. XYZ orthogonal coordinate axes are appropriately described to indicate directions of the drawings. An inspection apparatus 1 illustrated in FIG. 1 is an apparatus for inspecting a substrate 100 which is an example of an inspection object.

The substrate 100 may be various substrates such as a printed wiring substrate, a flexible substrate, a ceramic multilayer wiring substrate, an electrode plate for a liquid crystal display or a plasma display, a semiconductor substrate, a package substrate for a semiconductor package, and a film carrier. Note that the inspection object is not limited to a substrate, and may be, for example, an electronic component such as a semiconductor element (integrated circuit: IC), and may be any inspection object as long as the object is to be electrically inspected.

The inspection apparatus 1 illustrated in FIG. 1 includes inspection units 4U and 4D, a substrate fixing device 6, and an inspection processing unit 8. The substrate fixing device 6 is configured to fix the substrate 100 to be inspected at a predetermined position. The inspection units 4U and 4D include inspection jigs 3U and 3D. In the inspection units 4U and 4D, by a drive mechanism (not illustrated), the inspection jigs 3U and 3D can be moved in three axial directions of X, Y, and Z orthogonal to each other, and further the inspection jigs 3U and 3D can be rotated about the Z axis.

The inspection unit 4U is located above the substrate 100 fixed to the substrate fixing device 6. The inspection unit 4D is located below the substrate 100 fixed to the substrate fixing device 6. The inspection units 4U and 4D are configured such that the inspection jigs 3U and 3D for inspecting a circuit pattern formed on the substrate 100 are detachable. Hereinafter, the inspection units 4U and 4D are collectively referred to as an inspection unit 4.

Each of the inspection jigs 3U and 3D includes a plurality of contacts Pr, a support member 31 that holds a distal end portion of a plurality of the contacts Pr toward the substrate 100, and a base plate 321. The base plate 321 is provided with an electrode that comes into contact with and conducts to a rear end portion of the contacts Pr. The inspection units 4U and 4D include a connection circuit (not illustrated) that electrically connects the rear end portion of the contacts Pr to the inspection processing unit 8 via the electrodes of the base plate 321 and switches the connection.

The contact Pr is what is called a wire probe composed of a single member having a substantially rod-like shape. A plurality of through holes for supporting the contact Pr is formed in the support member 31. Each through hole is disposed so as to correspond to a position of an inspection point set on a wiring pattern of the substrate 100 to be inspected. In this manner, the distal end portion of the contact Pr is brought into contact with the inspection point of the substrate 100. The inspection point is, for example, a wiring pattern, a pad, a solder bump, a connection terminal, a through hole, a via, or the like.

The inspection jigs 3U and 3D are configured similarly to each other except that the mounting directions on the inspection units 4U and 4D are vertically opposite. Hereinafter, the inspection jigs 3U and 3D are collectively referred to as an inspection jig 3. The inspection jig 3 is replaceable according to the substrate 100 to be inspected.

The inspection processing unit 8 includes, for example, a power supply circuit, a voltmeter, an ammeter, a microcomputer, and the like. The inspection processing unit 8 controls a drive mechanism (not illustrated) to move and position the inspection units 4U and 4D, and brings distal ends of the contacts Pr into contact with the inspection points of the substrate 100. In this manner, the inspection points and the inspection processing unit 8 are electrically connected. In this state, the inspection processing unit 8 supplies current or voltage for inspection to the inspection points of the substrate 100 via the contacts Pr of the inspection jig 3, and executes, for example, inspection of the substrate 100 for disconnection, short circuit, or the like of a circuit pattern based on a voltage signal or a current signal obtained from the contacts Pr. Alternatively, the inspection processing unit 8 may measure an impedance to be inspected based on a voltage signal or a current signal obtained from the contacts Pr by supplying AC current or voltage to the inspection points.

Figure 2:
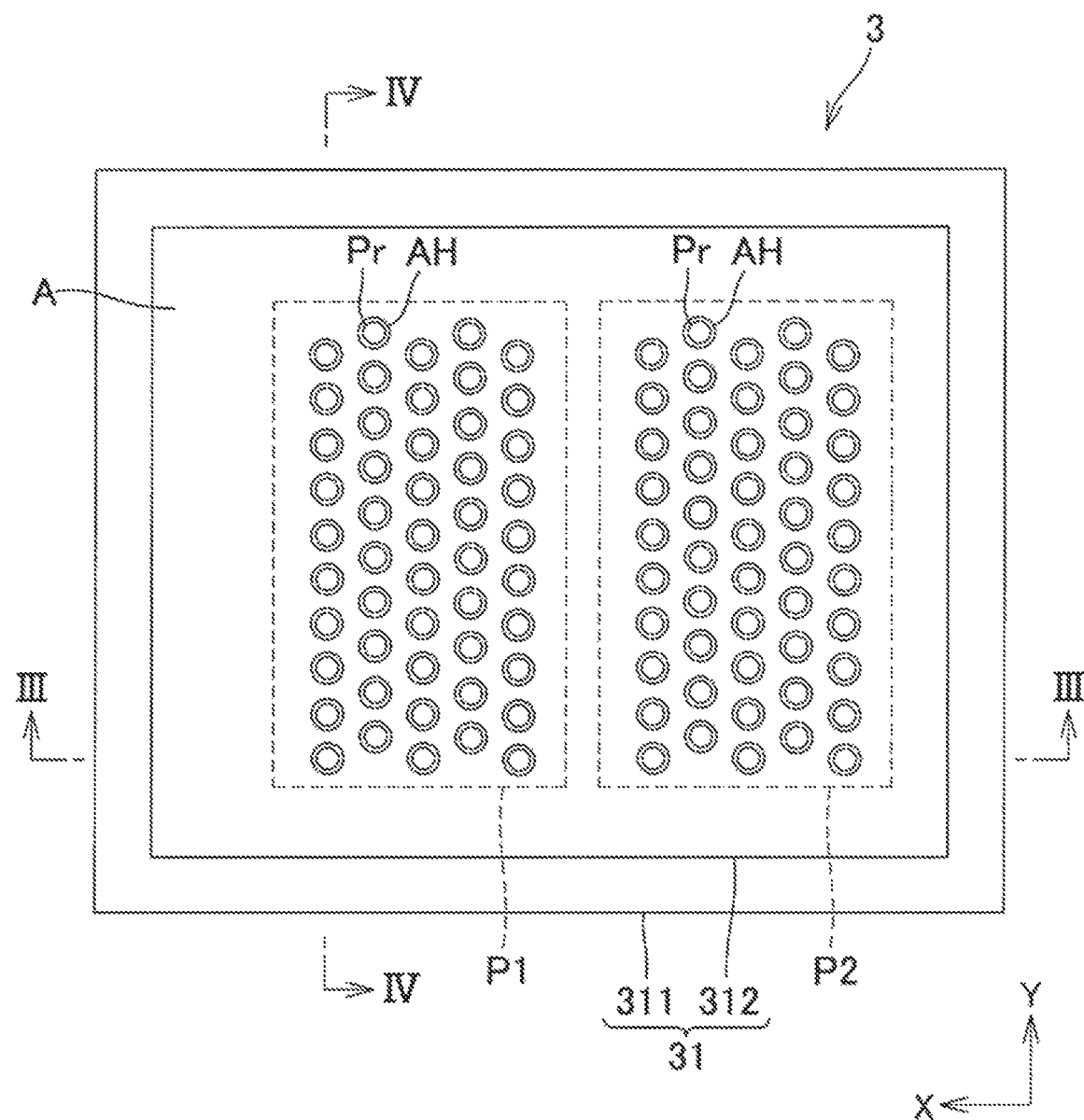
FIG. 2 is a plan view of the inspection jig 3 illustrated in FIG. 1 as viewed from the distal end side of a contact Pr.
Figure 3:
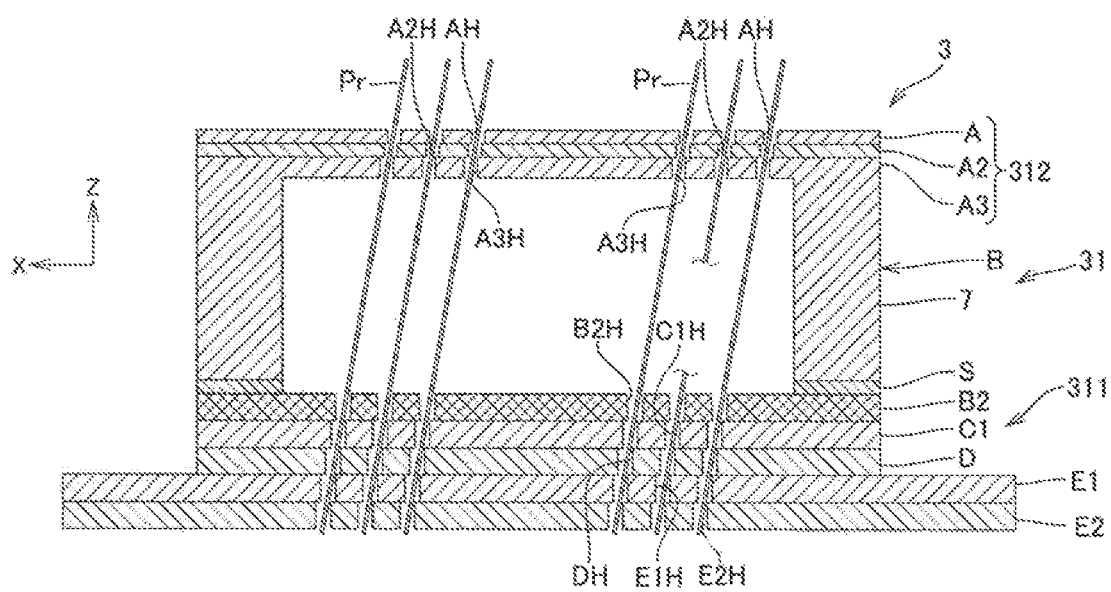
FIG. 3 is an end view taken along line III-III of the inspection jig 3 illustrated in FIG. 2.
Figure 4:
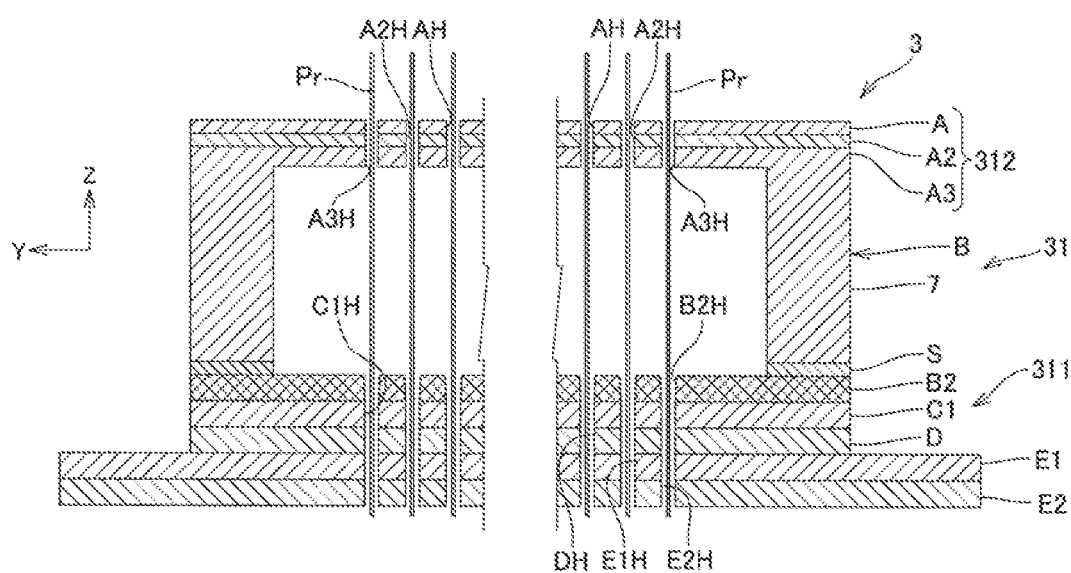
FIG. 4 is an end view taken along line IV-IV of the inspection jig 3 illustrated in FIG. 2.

Referring to FIGS. 2, 3, and 4, the support member 31 includes a first support portion 311 that supports the rear end portion side of the contact Pr, a second support portion 312 that supports the distal end side of the contact Pr, a separation holding member 7 that holds the first support portion 311 and the second support portion 312 by separating them from each other, and a spacer S.

The first support portion 311 is configured by stacking the facing support plate B2 and support plates C1, D, E1, and E2 in the Z direction. The facing support plate B2 and the support plates C1, D, E1, and E2 are stacked in this order from the side closer to the second support portion 312. That is, the facing support plate B2 is disposed to face the second support portion 312, and a plate closest to the second support portion 312 among a plurality of plates constituting the first support portion 311 is the facing support plate B2.

The first support portion 311 may be composed of one of the facing support plate B2. Further, the first support portion 311 may be composed of four or less plates or six or more plates including the facing support plate B2.

The through hole B2H for supporting the contact Pr is formed on the facing support plate B2. Through holes C1H, DH, E1H, and E2H for supporting the contact Pr are formed on the support plates C1, D, E1, and E2, respectively.

The rear end side of the contact Pr is inserted through the through holes B2H, C1H, DH, E1H, and E2H. In this manner, the rear end side of the contact Pr is supported by the first support portion 311.

Referring to FIGS. 3 and 4, the spacer S having a substantially rectangular frame shape is stacked on an outer peripheral portion of the facing support plate B2.

The second support portion 312 is formed by stacking support plates A, A2, and A3. The support plates A, A2, and A3 are stacked in this order from the side farther from the first support portion 311. Through holes AH, A2H, and A3H for supporting the contact Pr are formed on the support plates A, A2, and A3. The second support portion 312 may be composed of two or less or four or more support plates.

The distal end side of the contact Pr is inserted through the through holes AH, A2H, and A3H. In this manner, the distal end side of the contact Pr is supported by the second support portion 312.

The separation holding member 7 having a substantially rectangular tubular shape extends from an outer peripheral portion of the support plate A3. The support plate A3 and the separation holding member 7 are integrally formed. In this manner, a separation block B is formed by the support plate A3 and the separation holding member 7. Note that the support plate A3 and the separation holding member 7 may be separated.

An end surface of the separation holding member 7 is attached to a surface of the spacer S on the second support portion 312 side. In this manner, the facing support plate B2 and the support plate A3, that is, the first support portion 311 and the second support portion 312 are held to be separated by a distance obtained by adding the length of the separation holding member 7 in the Z direction and the thickness of the spacer S. The support plates A, A2, and A3, the facing support plate B2, and the support plates C1, D, E1, and E2 are held in parallel.

The spacer S is a member for finely adjusting the space between the first support portion 311 and the second support portion 312, and the inspection jig 3 does not need to include the spacer S.

Further, the separation holding member 7 is not limited to a rectangular tubular member. The separation holding member may be any member that holds the first support portion 311 and the second support portion 312 by separating them from each other. For example, a rod-like support column may be used as the separation holding member.

The through holes AH, A2H, A3H, B2H, C1H, DH, E1H, and E2H are provided perpendicular to the respective plates of the support plates A, A2, and A3, the facing support plate B2, and the support plates C1, D, E1, and E2 so as to correspond to each other such that the same contact Pr is inserted. The positions of the through holes AH, A2H, A3H, B2H, C1H, DH, E1H, and E2H corresponding to each other are shifted in the X direction with respect to the direction of the perpendicular line (Z direction) such that the contact Pr is inclined with respect to the perpendicular direction (Z direction) in each of the plates.

In this manner, the contact Pr is supported to be inclined in the same direction in the X direction with respect to the Z direction. The distal end of the contact Pr projects from the support plate A in a state of not being in contact with the substrate 100. Hereinafter, the through holes AH, A2H, A3H, B2H, C1H, DH, E1H, and E2H are collectively referred to as a through hole H. Note that the through hole H may penetrate while being inclined with respect to the perpendicular direction of each plate.

Figure 5:
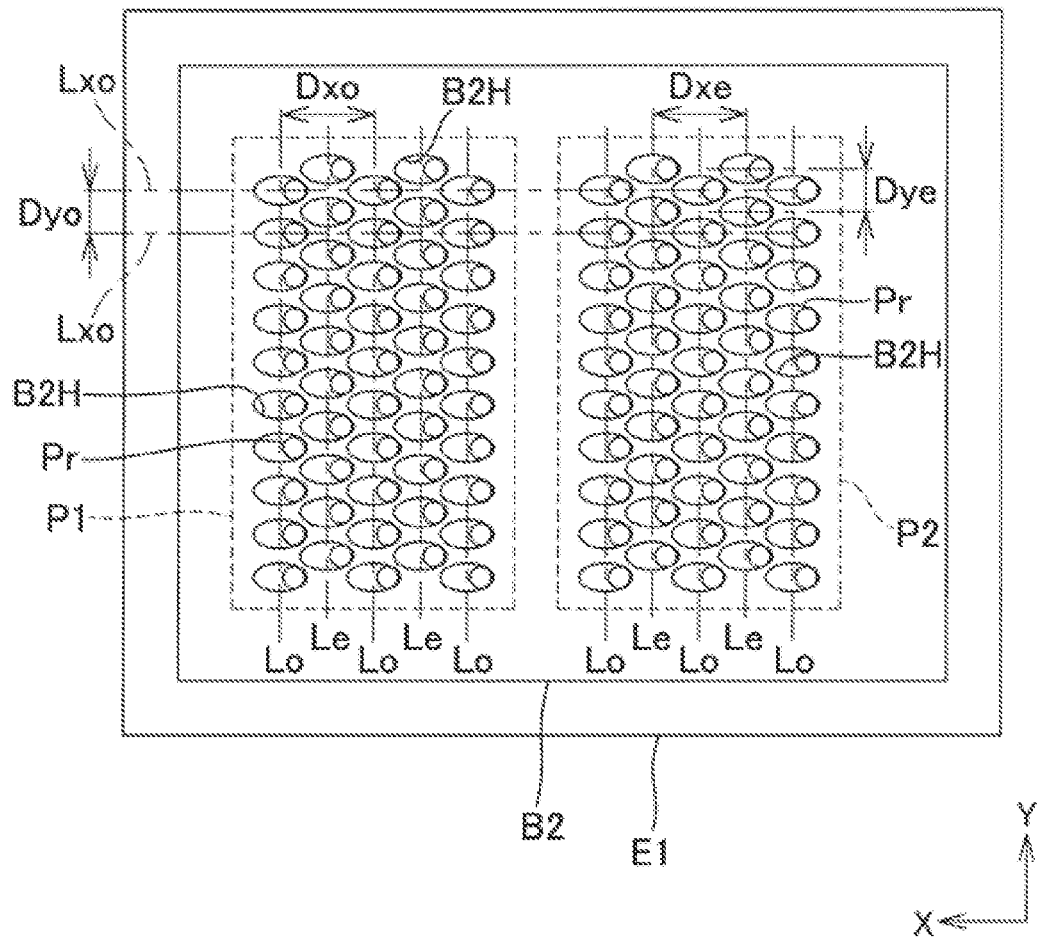
FIG. 5 is a plan view of a facing support plate B2 as viewed from a Z direction with a second support portion 312 and a spacer S removed from the inspection jig 3.

Referring to FIG. 5, the through hole B2H of the facing support plate B2 has an elliptical cross-sectional shape along the plane direction of the facing support plate B2.

A plurality of the through holes B2H are distributed in a first region P1 and a second region P2 extending in a substantially rectangular shape elongated in the Y direction. The Y direction corresponds to an example of the first direction, and the X direction corresponds to an example of the second direction.

Each of the through holes B2H has an elliptical shape whose major axis extends in the X direction. The X direction corresponds to an example of the specific direction along the plane direction of the facing support plate B2. The directions of the major axes of the through holes B2H are aligned in the X direction. That is, the specific direction is the X direction (second direction).

The through holes B2H are arranged at equal intervals in the first region P1 and the second region P2. The first region P1 and the second region P2 are separated by a distance larger than the space between the through holes B2H in the same region.

A plurality of the through holes B2H are arranged in a manner divided into an odd column Lo and an even column Le extending in parallel to each other along the Y direction (first direction). Each of the through holes B2H in the even column Le is located between straight lines Lxo in the X direction (second direction) passing through the center of the through holes B2H in the odd column Lo.

A distance Dyo between the centers of the through holes B2H adjacent in the Y direction (first direction) in each of the odd columns Lo is shorter than a distance Dxo between the centers of the through holes B2H of the odd columns Lo adjacent in the X direction (second direction). A distance Dye between the centers of the through holes B2H adjacent in the Y direction (first direction) in each of the even columns Le is shorter than a distance Dxe between the centers of the through holes B2H of the even columns Le adjacent in the X direction (second direction).

Figure 6:
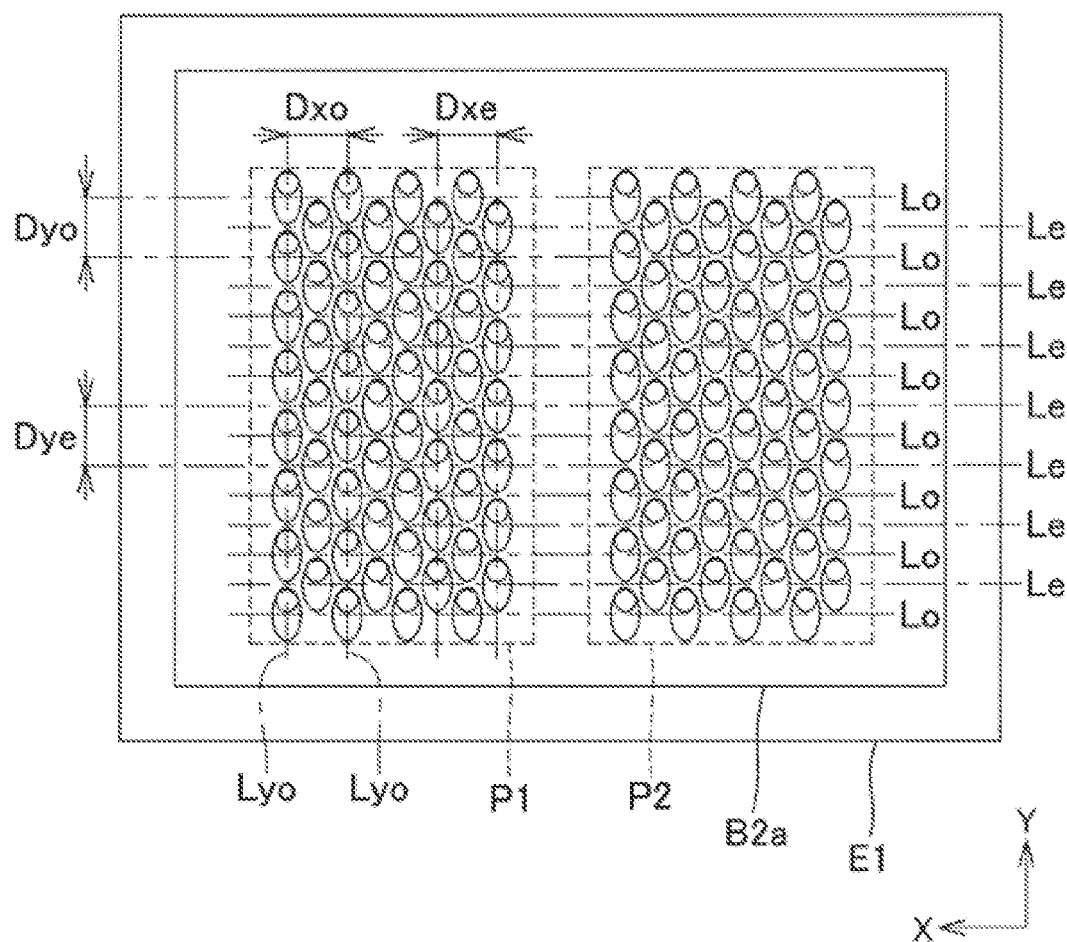
FIG. 6 is a plan view illustrating a variation of the facing support plate B2 illustrated in FIG. 5.

In a facing support plate B2a illustrated in FIG. 6, major axes of the through holes B2H are aligned in the Y direction. That is, in the example illustrated in FIG. 6, the specific direction is the Y direction (second direction), and the X direction corresponds to the first direction.

A plurality of the through holes B2H are arranged in a manner divided into the odd column Lo and the even column Le extending in parallel to each other along the X direction (first direction). Each of the through holes B2H in the even column Le is located between straight lines Lyo in the Y direction (second direction) passing through the center of the through holes B2H in the odd column Lo.

The distance Dxo between the centers of the through holes B2H adjacent in the X direction (first direction) in each of the odd columns Lo is equal to the distance Dyo between the centers of the through holes B2H of the odd columns Lo adjacent in the Y direction (second direction). The distance Dxe between the centers of the through holes B2H adjacent in the X direction (first direction) in each of the even columns Le is equal to the distance Dye between the centers of the through holes B2H of the even columns Le adjacent in the Y direction (second direction).

In the example illustrated in FIG. 6, the contact Pr is inclined in the Y direction. The position of the through hole H of each plate is shifted in the Y direction with respect to the Z axis so as to incline the contact Pr in the Y direction with respect to the Z direction.

In the facing support plate B2 illustrated in FIG. 5, the directions of the major axes of the through holes B2H are aligned in the X direction, the distance Dyo between the centers of the through holes B2H adjacent to each other in the Y direction (first direction) in each of the odd columns Lo is shorter than the distance Dxo between the centers of the through holes B2H in the odd columns Lo adjacent to each other in the X direction (second direction), and the distance Dye between the centers of the through holes B2H adjacent to each other in the Y direction (first direction) in each of the even columns Le is shorter than the distance Dxe between the centers of the through holes B2H in the even columns Le adjacent to each other in the X direction (second direction).

As a result, an adjacent distance between the contacts Pr in the direction in which the contacts Pr are inclined and bent (the X direction in the facing support plate B2 and the Y direction in the facing support plate B2a) is larger in the facing support plate B2 illustrated in FIG. 5 that satisfies the above condition than in the facing support plate B2a illustrated in FIG. 6 that does not satisfy the above condition. As the adjacent distance between the contacts Pr in the direction in which the contacts Pr bend is larger, the possibility of contact between the contacts Pr can be reduced in the facing support plate B2 than in the facing support plate B2a.

In the facing support plate B2 shown in FIG. 5, the through holes B2H are provided in 5 columns in zigzag in the X direction (specific direction) and in 20 columns in zigzag in the Y direction (third direction) in the first region P1. Similarly, the through holes B2H are provided in 5 columns in zigzag in the X direction (specific direction) and in 20 columns in zigzag in the Y direction (third direction) in the second region P2.

That is, in the first region P1 and the second region P2 in which the through holes B2H are arranged at equal intervals, the number of columns of the through holes B2H corresponding to the X direction (specific direction) is smaller than the number of columns of the through holes B2H corresponding to the Y direction (third direction). Note that the through holes B2H may be arranged linearly with respect to the X direction and the Y direction, that is, in a lattice shape, without limitation to the example of being arranged in zigzag. Further, although the example in which there are two regions in which the through holes B2H are arranged at equal intervals, the number of such regions may be one or three or more.

As described above, since the positions of the through holes H are shifted in the X direction (specific direction) with respect to the direction of the perpendicular line (Z direction), the direction of the shift of the through holes H is along the X direction (specific direction) in which the number of columns of the through holes H is small.

Figure 7:
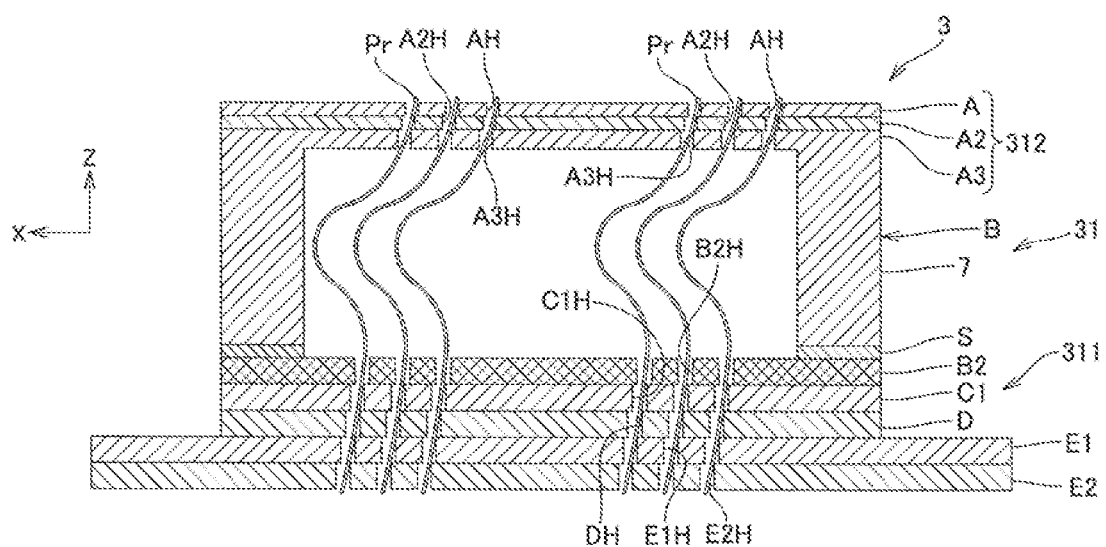
FIG. 7 is an explanatory view illustrating an example of a state in which the inspection jig 3 is caused to abut on a substrate 100.

When the inspection jig 3 is brought into contact with the substrate 100 in order to inspect the substrate 100, the distal end of each of the contacts Pr is pressed into the second support portion 312 as illustrated in FIG. 7. At this time, since the contacts Pr are supported to be inclined in the same direction in the X direction, the contacts Pr bend in the X direction to absorb a pressing amount of the contacts Pr.

Here, since the bending direction of the contact Pr is along the X direction (specific direction) which is the major axis direction of the through hole B2H, the inclination direction of the contact Pr and the bending direction of the contact Pr are also the X direction in which the number of columns of the through holes H is small.

When the contact Pr bends, the possibility of contact between the contacts Pr adjacent to each other in the bending direction increases. However, in the inspection jig 3, since the contacts Pr bend along the X direction (specific direction) in which the number of columns of the through holes B2H is small, the possibility of contact between the contacts Pr is low as compared with the case in which the contacts Pr bend along the Y direction (third direction) in which the number of columns of the through holes B2H is large.

As in the case of, for example, using the facing support plate B2a illustrated in FIG. 6, the specific direction that is the major axis direction of the through holes B2H does not need to be along the direction in which the number of columns of the through holes B2H is small (X direction in FIG. 6).

Figure 8:
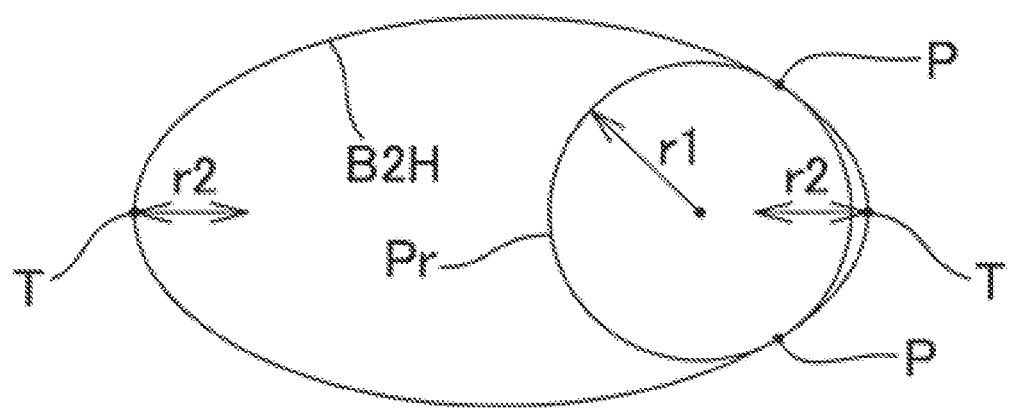
FIG. 8 is an enlarged view of a through hole B2H of the facing support plates B2 and B2a and the contact Pr.

Referring to FIG. 8, the contact Pr has a cylindrical shape, and a radius of r1. The radius of curvature r2 of both end portions T in the major axis direction (specific direction) of the cross section of the through hole B2H is smaller than the radius r1 of the contact Pr. As a result, an inner wall on one end side in the major axis direction (specific direction) of the through hole B2H and the contact Pr come into contact with each other at two contact positions P.

In this case, if the contact Pr is inclined in the through hole B2H, the contact Pr comes into contact with the inner wall of the through hole B2H at two points. If the contact Pr extends in the Z direction, that is, in the axial direction of the through hole B2H in the through hole B2H, the contact Pr comes into contact with the inner wall of the through hole B2H at two lines.

As described above, since the radius of curvature r2 of the both end portions T of the through hole B2H is smaller than the radius r1 of the contact Pr, the contact Pr can be brought into contact with the inner wall of the through hole B2H at two points or two lines. The contact Pr comes into contact with the inner wall of the through hole B2H at two points or two lines, so that the movement of the contact Pr in the minor axis direction (direction orthogonal to the specific direction) of the through hole B2H can be reduced.

Further, in a case where the through hole B2H has a hole shape in which the radius of curvature r2 of the both end portions T of the through holes B2H is smaller than the radius r1 of each of the contacts Pr, and arrangement in which the through holes B2H of the even column Le are positioned between the straight lines Lxo passing through the centers of the through holes B2H of the odd column Lo, that is, what is called staggered arrangement is employed, an effect described below can be obtained. That is, in such a case, as compared with a case where through holes having an elliptical cross-sectional shape constituted by a pair of parallel lines and a pair of semicircles are arranged in a staggered manner, the distance between the through holes B2H adjacent to each other in the oblique direction is increased even when the center positions of the holes are arranged in the same manner. As a result, it is easy to narrow the adjacent pitch of the through holes B2H while maintaining the wall thickness between the through holes B2H.

Figure 9:
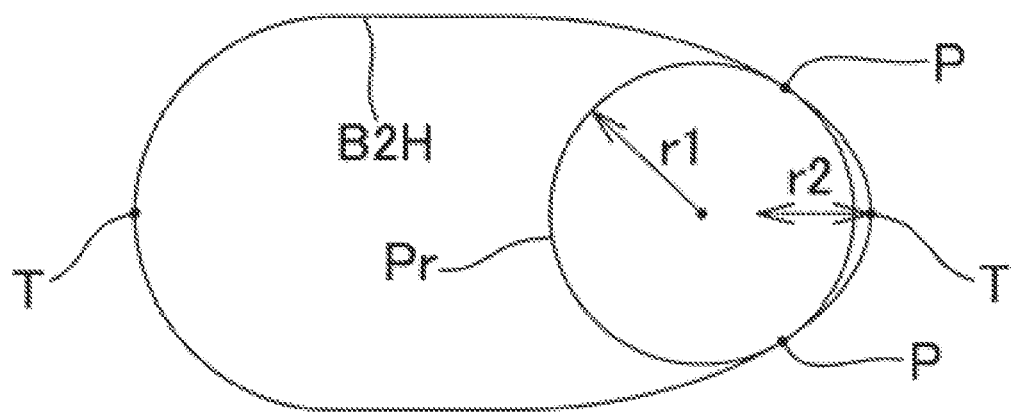
FIG. 9 is an explanatory view illustrating a variation of the through hole B2H illustrated in FIG. 8.

Note that the cross-sectional shape of the through hole B2H is not necessarily limited to an ellipse. The contact Pr is supported in a manner inclined with respect to a perpendicular line of the facing support plates B2 and B2a. Therefore, the contact Pr contacts only one of the both end portions T. For this reason, for example, as illustrated in FIG. 9, the configuration may be such that only the radius of curvature r2 of one of the end portions T on the side where the contact Pr contacts has a shape smaller than the radius r1 of the contact Pr.

Figure 10:
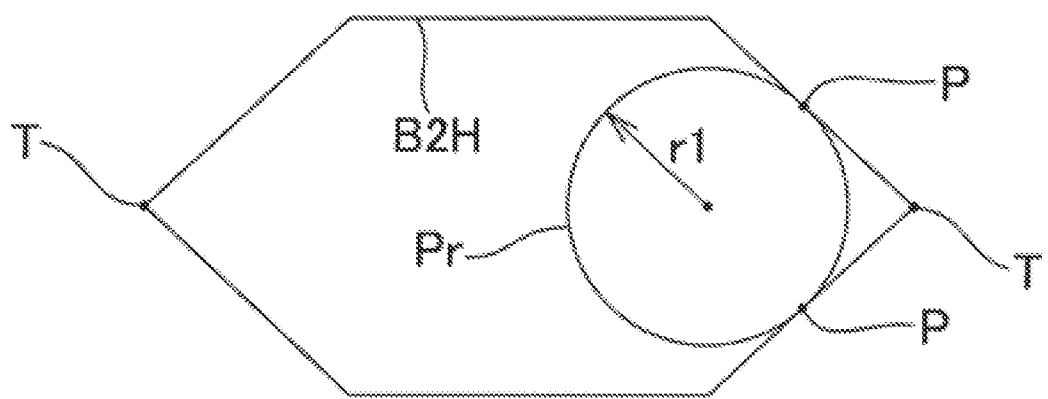
FIG. 10 is an explanatory view illustrating an example of the polygonal through hole B2H.

Further, for example, as illustrated in FIG. 10, the cross-sectional shape of the through hole B2H may be a polygonal shape. Also in the polygonal through hole B2H illustrated in FIG. 10, similarly to the through hole B2H illustrated in FIG. 9, the configuration may be such that only one of the end portions T on the side where the contact Pr contacts has a polygonal shape.

That is, the cross section of the through hole B2H may have a shape elongated in the specific direction along the plane direction of the facing support plates B2 and B2a, and may have a shape in which the inner wall of the through hole B2H on one end side in the specific direction and the contact Pr inserted into each of the through holes B2H are in contact with each other at two points or two lines. When each of the through holes B2H has such a shape, the contact Pr comes into contact with the inner wall of the through hole B2H at two points or two lines. As a result, the movement of the contact Pr in the minor axis direction of the through hole B2H can be reduced.

Further, since the cross-sectional shape of the through hole B2H has a shape elongated in a specific direction such as an ellipse, the bending directions of the contacts Pr are easily aligned. As a result, the variation in an amount of bending in which the contacts Pr bend in the direction orthogonal to the specific direction is reduced, so that it is easy to narrow the interval at which the through holes H are arranged in the direction orthogonal to the specific direction. As a result, it is easy to reduce the arrangement interval of the contacts Pr with respect to the direction orthogonal to the specific direction. Further, it is not necessary to use a guide film that supports an intermediate portion of a plurality of contacts by bending the intermediate portion in one direction as in the conventional technique, so that the configuration of the inspection jig can be easily simplified.

Referring to FIGS. 3 and 4, the support plates A, A2, and A3, the separation holding member 7, the spacer S, the facing support plate B2 (B2a), and the support plates C1, D, E1, and E2 are made from an insulating material, for example, a resin material. The facing support plate B2 (B2a)

has a bending strength stronger than that of the support plates C1, D, E1, and E2. The facing support plate B2 (B2a) can be made from a material such as ceramics or fine ceramics.

The bending strength of the facing support plates B2 and B2a can be evaluated, for example, in accordance with JIS R 1601 "Testing method for flexural strength (modulus of rupture) of fine ceramics at room temperature" or ISO 14704. The bending strength of the support plates C1, D, E1, and E2 can be evaluated, for example, in accordance with JIS K 7171 "Plastics-Determination of flexural properties" or ISO 178.

The method for evaluating the bending strength of each plate is as described below. Two locations sandwiching the through hole through which the contact is scheduled to pass through the support plate when the support plate is incorporated in the inspection jig, two locations where the stacked body of the facing support plate and the support plate faces the separation holding member are set as external supporting points, and a substantial center between the two external supporting points are set as a load point. In a case where an opening larger than an indenter of a load measuring device has a plate shape that is substantially at the center between the two external supporting points and cannot be applied with the load of the load measuring device, a location where the load is applied to the plate in the vicinity of the substantial center between the two external supporting points may be set as the load point. A stroke of the load measuring device when a predetermined load is applied to the load point to such an extent that the plate is not broken is measured. It can be evaluated that the bending strength is larger as the stroke is smaller. An optional value may be selected as the predetermined load, and the predetermined load is not limited to a measurement condition in the above standard. It is sufficient to evaluate the bending strength with the shape and dimension without processing of the plate regardless of the specifications of the shape, dimension, surface roughness, and the like of a test piece in the above standard. Regardless of the specification of the number of test pieces in the above standard, the number of plates used for the evaluation of the bending strength may be one.

The bending strength of the facing support plates B2 and B2a is larger than that of the support plates C1, D, E1, and E2. As a result, the bending of the support plates C1, D, E1, and E2 is reduced by the facing support plates B2 and B2a, and the stress applied to the support portion that supports the contact can be reduced.

Hereinafter, in the inspection jig in which the bending strength of the facing support plates B2 and B2a is not high, a mechanism in which stress is applied to the support portion that supports the contact will be described.

Figure 11:
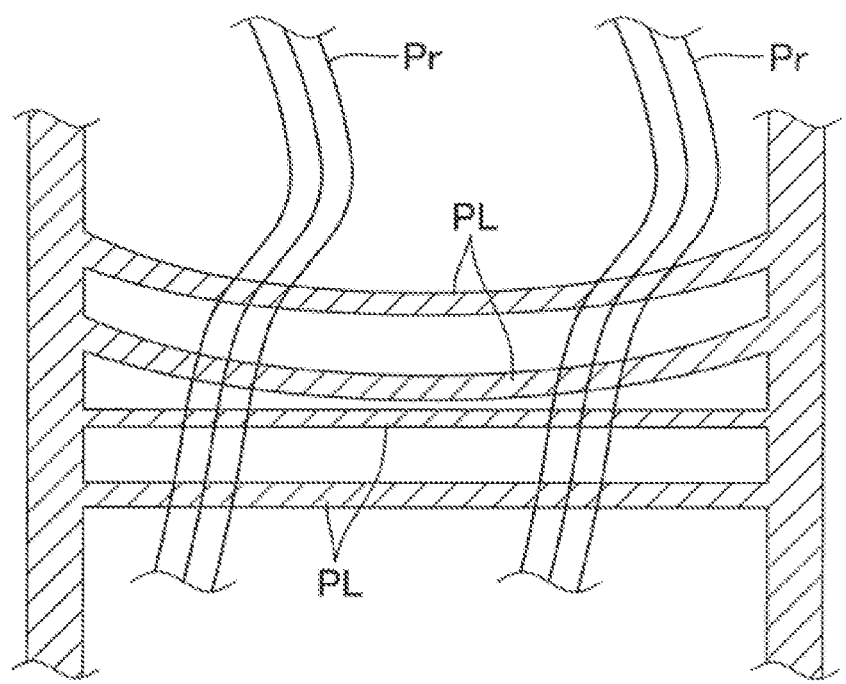
FIG. 11 is an explanatory view conceptually illustrating behavior of a plate PL when the contact Pr is pressed.
Figure 12:
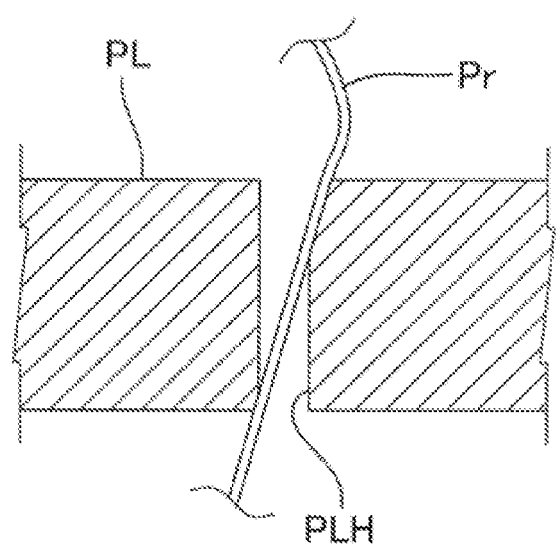
FIG. 12 is an enlarged explanatory view of a through hole PLH formed on the plate PL and the contact Pr.

Specifically, as illustrated in FIG. 11, when the inspection jig abuts on an inspection object and the contact Pr is pressed and bent, a plate PL is pressed and bent by the bent contact Pr. More specifically, as illustrated in FIG. 12, the bent contact Pr hits an opening edge portion of a through hole PLH of the plate PL and is caught, and strongly presses the plate PL.

Figure 13:
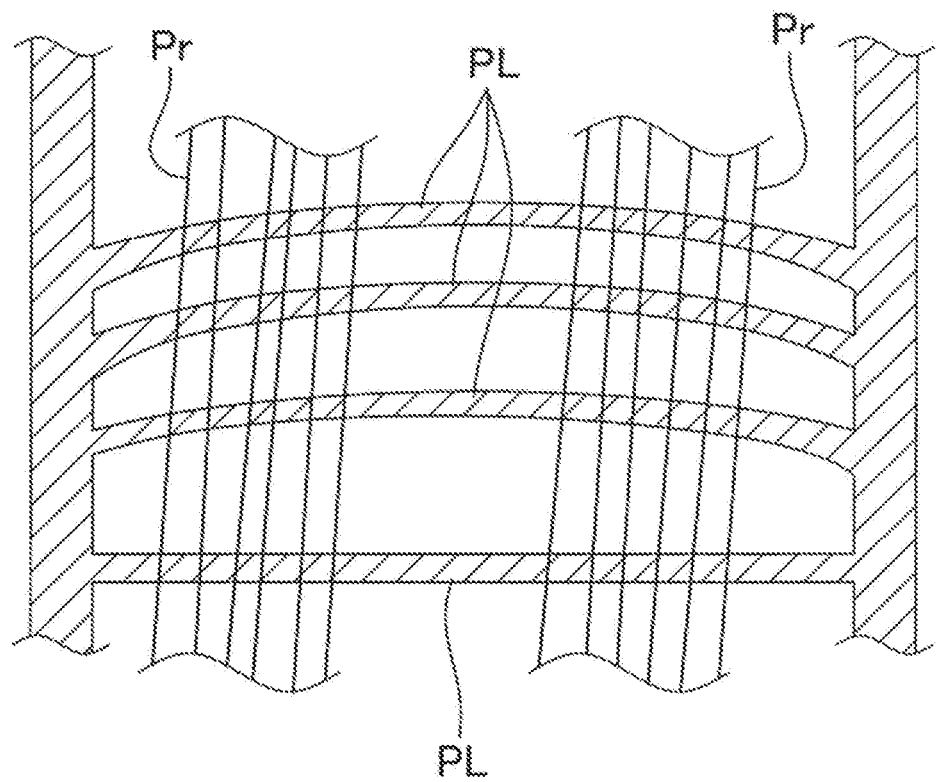
FIG. 13 is an explanatory view conceptually illustrating behavior of the plate PL when pressing load of the contact Pr is released.
Figure 14:
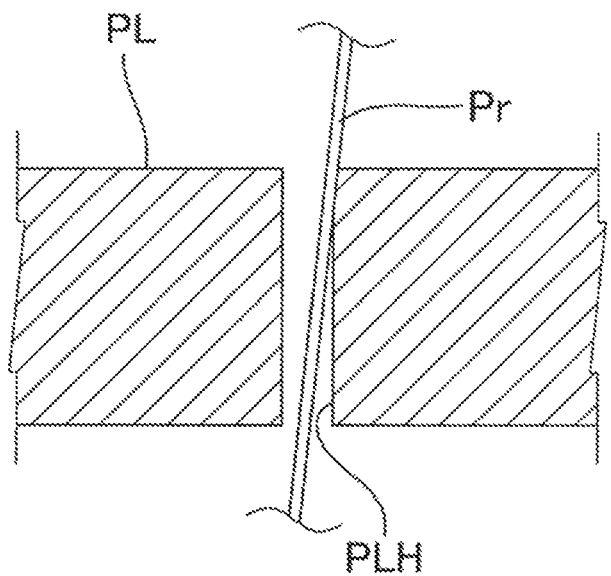
FIG. 14 is an enlarged explanatory view of the through hole PLH formed on the plate PL and the contact Pr.

In this state, when the inspection jig is separated from the inspection object and the contact Pr is about to return to the original position, the plate PL is pulled by the contact Pr and bent in the opposite direction as illustrated in FIG. 13. More specifically, the bent contact Pr is strongly pressed against an inner wall of the through hole PLH. For this reason, as illustrated in FIG. 14, a large frictional force is generated between the contact Pr and the through hole PLH, and when the contact Pr returns to the original state, the contact Pr pulls the plate PL, and the plate PL is bent in the opposite direction. As described above, when the plate PL bends, stress is applied to the plate PL as a support portion that supports the contact Pr.

On the other hand, since the inspection jig 3 includes the facing support plates B2 and B2a having bending strength stronger than bending strength of the support plates C1, D, E1, and E2, bending of the facing support plates B2 and B2a themselves is reduced, and bending of the support plates C1, D, E1, and E2 is suppressed by the facing support plates B2 and B2a. Therefore, as a result of the reduction in bending of the facing support plates B2 and B2a and the support plates C1, D, E1, and E2, it is easy to reduce stress applied to the facing support plates B2 and B2a and the support plates C1, D, E1, and E2, which are the support portions that support the contact Pr.

Figure 15:
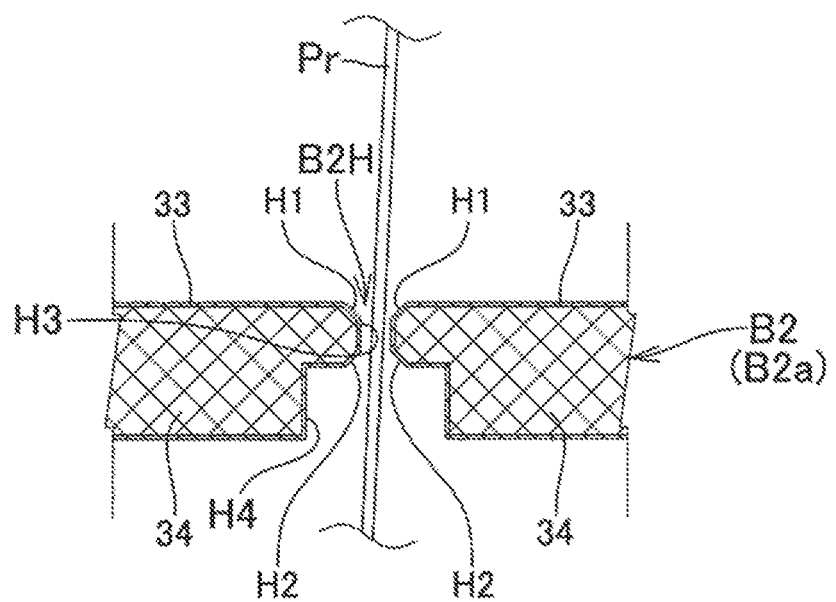
FIG. 15 is an end view illustrating the vicinity of the through hole B2H of the facing support plate B2 in an enlarged manner.

Referring to FIG. 15, an opening edge portion of the through hole B2H of the facing support plates B2 and B2a is chamfered to form chamfered portions H1 and H2. A portion of the inner surface of the through hole B2H excluding the chamfered portions H1 and H2 is a through hole main body portion H3. That is, the inner surface of the through hole B2H includes the through hole main body portion H3 and the chamfered portions H1 and H2. In the facing support plates B2 and B2a, for example, a large diameter portion H4 coaxial with the through hole B2H and having a larger diameter than the through hole B2H is connected to the through hole B2H.

When the contact Pr is bent, a large part of the load applied to the first support portion 311 due to the bending is applied to the chamfered portion H1 of the through hole B2H of the facing support plates B2 and B2a. For this reason, a frictional force generated by friction of the contact Pr is the largest in the through hole B2H among the through holes B2H, C1H, DH, E1H, and E2H.

In view of the above, by chamfering the chamfered portions H1 and H2 in the through hole B2H of the facing support plates B2 and B2a, it is possible to reduce the possibility that the contact Pr is damaged by friction with the chamfered portions H1 and H2. The chamfering may be performed to obtain a round surface with a round corner, a bevel surface with an obliquely cut corner, or various other chamfered shapes.

Note that an opening edge portion of the through hole H in the support plates other than the facing support plates B2 and B2a may also have a chamfered shape. Similarly to the through hole B2H, a large diameter portion and a small diameter portion may be connected to the through hole H of each plate. In this case, the opening edge portion of the small diameter portion of the through hole H is preferably chamfered.

Further, in the inspection jig 3, a smooth layer 33 which is, for example, a coating layer for reducing friction is preferably formed on the inner surface of the through hole H of the facing support plates B2 and B2a and the support plates A, A2, A3, C1, D, E1, and E2. As illustrated in FIG. 15, the smooth layer 33 may be formed on an entire surface of each plate including the inner surface of the through hole H. However, since the contact Pr is not in contact with a portion other than the inner surface of the through hole H, the smooth layer 33 does not need to be formed in a portion other than the inner surface of the through hole H.

Further, the smooth layer 33 may be formed on at least one of the through hole main body portion H3 and the chamfered portion H1 of the inner surface of the through hole H.

The thickness of the smooth layer 33 is, for example, about 1 μm. A friction coefficient of the smooth layer 33 with respect to the contact Pr is smaller than a friction coefficient of a base portion 34 of the smooth layer 33 on each plate. The smooth layer 33 can be formed by, for example, depositing a material having a small friction coefficient. The magnitude of the friction coefficient may be compared between dynamic friction coefficients or between static friction coefficients.

As a material of the smooth layer 33, for example, a paraxylylene-based polymer can be used, and an insulating material having a small friction coefficient, such as parylene (registered trademark), fluorine, polyester, or acrylic, is preferable.

By forming the smooth layer 33 on the inner surface of the through hole H in this manner, friction between the through hole H and the contact Pr can be reduced.

Note that, since the contact Pr bends on the second support portion 312 side of the facing support plates B2 and B2a, friction between the chamfered portion H1 on the second support portion 312 side and the contact Pr is larger than friction between the chamfered portion H2 on the support plate C1 side and the contact Pr. Therefore, although FIG. 15 shows the example in which both the chamfered portions H1 and H2 are chamfered, the configuration may be such that only the chamfered portion H1 on the second support portion 312 side having a larger friction with the contact Pr between the chamfered portions H1 and H2 is chamfered.

Alternatively, the configuration may be such that the chamfered portions H1 and H2 in the through hole B2H of the facing support plates B2 and B2a are not chamfered.

Further, the contact Pr bends on the second support portion 312 side of the facing support plates B2 and B2a. For this reason, contact pressure between the contact Pr and the through holes B2H of the facing support plates B2 and B2a is likely to be higher than contact pressure between the contact Pr and the through hole H of the other support plates, and friction is likely to occur. Therefore, it is sufficient that the smooth layer 33 is formed at least on the inner surface of the through hole B2H of the facing support plates B2 and B2a, and the smooth layer 33 does not need to be formed on the other plates.

Further, the through hole H of the plates other than the support plates A and E2 preferably has the same shape as the through hole B2H of the facing support plates B2 and B2a. However, when the contact Pr is bent, the load applied to the through hole B2H of the facing support plates B2 and B2a due to the bending is larger than the load applied to the through holes H of the other plates. Therefore, the shape of the through hole H of the support plate other than the facing support plates B2 and B2a may be different from the shape of the through hole B2H, and may have, for example, a circular cross-sectional shape.

The through holes H of the support plates A and E2 may have the same shape as the through holes B2H of the facing support plates B2 and B2a. However, the through holes H of the support plates A and E2 more preferably have a circular or square cross section from the viewpoint of positioning an end portion of the contact Pr at the inspection point and the electrodes.

Further, the positions of the through holes H of the plates do not need to be shifted, and the contact Pr is not limited to the example of being supported in an inclined manner. Further, the facing support plates B2 and B2a are not limited to the example in which the bending strength is stronger than that of the support plates C1, D, E1, and E2.

That is, the inspection jig according to an example of the present disclosure includes a plurality of contacts each of which has a rod shape, a first support portion that supports a first end portion side of the plurality of contacts, and a second support portion that supports a second end portion side of the plurality of contacts. The first support portion includes a facing support plate that is disposed to face the second support portion in a manner separated from the second support portion and has a plurality of through holes through which the plurality of contacts are inserted, and a cross section of each of the through holes has an elliptical shape whose major axis extends in a predetermined specific direction along a plane direction of the facing support plate.

According to this configuration, the rod-like contact is inserted into the through hole having an elliptical cross section, and the major axis directions of the elliptical shapes of the through holes are aligned in the specific direction. As a result, the bending directions of the contacts are easily aligned in the specific direction. Therefore, it is easy to align the bending directions of the contacts without using a guide film that supports an intermediate portion of the plurality of contacts by bending the intermediate portion in one direction as in the conventional technique, so that the configuration of the inspection jig can be easily simplified.

Further, the plurality of contacts preferably have a cylindrical shape, and a radius of curvature of both end portions of the cross section in the specific direction is preferably smaller than a radius of each of the contacts.

According to this configuration, an inner wall on one end side in the specific direction that is the major axis direction of the through hole and the contact are in contact with each other at two points or two lines. As a result, the movement of each of the contacts in the direction orthogonal to the specific direction can be reduced.

Further, the inspection jig according to an example of the present disclosure includes a plurality of contacts each of which has a rod shape, a first support portion that supports the first end portion side of the plurality of contacts, and a second support portion that supports the second end portion side of the plurality of contacts. The first support portion includes a facing support plate that is disposed to face the second support portion in a manner separated from the second support portion and has a plurality of through holes through which the plurality of contacts are inserted, a cross section of each of the through holes has a shape elongated in a predetermined specific direction along a plane direction of the facing support plate, and an inner wall on one end side in the specific direction of each of the through holes and a contact inserted through each of the through holes are in contact with each other at two points or two lines.

According to this configuration, the rod-like contact is inserted into the through hole having the cross-sectional shape elongated in the specific direction, and the longitudinal directions of the cross-sectional shapes of the through holes are aligned in the specific direction. As a result, the bending directions of the contacts are easily aligned in the specific direction. Therefore, it is easy to align the bending directions of the contacts without using a guide film that supports an intermediate portion of the plurality of contacts by bending the intermediate portion in one direction as in the conventional technique, so that the configuration of the inspection jig can be easily simplified. Furthermore, the inner wall on one end side in the specific direction of the through hole and the contact inserted into the through hole come into contact with each other at two points or two lines. As a result, the movement of each of the contacts in the direction orthogonal to the specific direction can be reduced.

Further, a plurality of the through holes are preferably disposed in a manner divided into an odd column and an even column extending in parallel to each other along a predetermined first direction, and each of the through holes in the even column preferably passes through a center of each of the through holes in the odd column and is preferably located between straight lines in a second direction orthogonal to the first direction.

According to this configuration, the contacts can be arranged in what is called staggered arrangement. As a result, it is easy to reduce the distance between the contacts.

Further, a distance between centers of the through holes adjacent to each other in the first direction in each of the odd columns is preferably shorter than a distance between centers of the through holes of the odd columns adjacent to each other in the second direction, a distance between centers of the through holes adjacent to each other in the first direction in each of the even columns is preferably shorter than a distance between centers of the through holes of the even columns adjacent to each other in the second direction, and the specific direction is preferably the second direction.

According to this configuration, the specific direction in which the contact is easily bent is the second direction. Then, the distance between the centers of the through holes adjacent to each other in the second direction is longer than the distance between the centers of the through holes adjacent to each other in the first direction. As a result, the adjacent distance between the contacts in the direction in which the contacts bend is larger than that in the direction orthogonal to the bending direction. As the adjacent distance between the contacts in the direction in which the contacts bend becomes large, it is possible to reduce the possibility that the contacts come into contact with each other due to bending.

Further, an opening edge portion on the second support portion side of each of the through holes is preferably chamfered.

The contact bends between the first support portion and the second support portion. That is, the contact bends on the second support portion side of the facing support plate located on the second support portion side in the first support portion. Therefore, a load due to bending of the contact is likely to be applied to the opening edge portion on the second support portion side of each of the through holes of the facing support plate. According to this configuration, the opening edge portion on the second support portion side of each of the through holes of the facing support plate to which a load is likely to be applied is chamfered. Accordingly, friction between the opening edge portion of the through hole and the contact is reduced.

Further, a smooth layer for reducing friction is preferably formed on an inner surface of each of the through holes, and a friction coefficient of the smooth layer with respect to the contact is preferably smaller than a friction coefficient of a base portion of the smooth layer on the facing support plate.

According to this configuration, friction between the contact and an inner surface of each of the through holes can be reduced.

Further, an opening edge portion on the second support portion side of each of the through holes is preferably a chamfered portion by being chamfered, a smooth layer for reducing friction is preferably formed on at least one of a through hole main body portion which is a portion excluding the chamfered portion and the chamfered portion on an inner surface including the chamfered portion of each of the through holes, and a friction coefficient of the smooth layer with respect to the contact is preferably smaller than a friction coefficient of a base portion of the smooth layer on the facing support plate.

According to this configuration, friction between the contact and at least one of the through hole main body and the chamfered portion in each of the through holes can be reduced.

Further, the first support portion preferably includes a support plate located on the opposite side to the second support portion on the facing support plate, and the facing support plate has a bending strength larger than that of the support plate.

According to this configuration, the first support portion includes the facing support plate and the support plate. Since the contact is greatly bent between the first support portion and the second support portion, the facing support plate on the side close to the second support portion is most likely to receive a force due to the bending of the contact. Since the bending strength of the facing support plate, which is most susceptible to the force due to the bending of the contact, is large, it is easy to reduce the stress applied to the first support portion.

Further, the first support portion preferably includes a support plate located on the opposite side to the second support portion on the facing support plate, a plurality of corresponding through holes are preferably formed in the support plate such that the same contact is inserted into a plurality of through holes of the facing support plate, as to the through holes of the facing support plate and the through hole of the support plate corresponding to each other, a position of the through hole of the facing support plate and a position of the through hole of the support plate are preferably shifted with respect to a perpendicular line of the facing support plate so that the contact is inclined with respect to the perpendicular line, and a direction of the shift is preferably along the specific direction.

According to this configuration, it is easy to support the contact in an inclined manner in the specific direction by the through holes of the facing support plate and the support plate.

Further, a plurality of the through holes are preferably arranged in a plurality of columns along the specific direction and arranged in a plurality of columns along a third direction intersecting the first direction, and, in a region where the through holes are arranged at equal intervals, number of columns arranged in the specific direction is preferably smaller than number of columns arranged in the third direction.

According to this configuration, the number of columns in which the contacts are arranged in the specific direction in which the contacts are easily bent is smaller than that in the third direction in which the contacts are not easily bent. Therefore, since the contacts are easily bent in a direction in which the number of columns of the through holes is small, that is, the number of columns of the contacts is small, the possibility of contact between the contacts is reduced as compared with the case where the contacts are bent along the third direction in which the number of columns is large.

An inspection apparatus according to an example of the present disclosure includes the inspection jig described above and an inspection processing unit that inspects an inspection object based on an electric signal obtained by bringing the contact into contact with an inspection point provided on the inspection object.

According to this configuration, it is easy to simplify the configuration of the inspection jig used for an inspection.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig comprising:
a plurality of contacts each of which has a rod shape;
a first support portion that supports a first end portion side of the plurality of contacts; and
a second support portion that supports a second end portion side of the plurality of contacts, wherein
the first support portion includes a facing support plate that is disposed to face the second support portion in a manner separated from the second support portion and has a plurality of through holes through which the plurality of contacts are inserted, and
a cross section of each of the through holes has an elliptical shape whose major axis extends in a predetermined specific direction along a plane direction of the facing support plate,
wherein the through holes are configured to hinder movement of the contacts in a direction that is along the plane direction of the facing support plate and is perpendicular to the predetermined specific direction.

2. The inspection jig according to claim 1, wherein
the plurality of contacts have a cylindrical shape, and
a radius of curvature of both end portions of the cross section in the specific direction is smaller than a radius of each of the contacts.

3. The inspection jig according to claim 1, wherein
the plurality of through holes are disposed in a manner divided into an odd column and an even column extending in parallel to each other along a predetermined first direction, and
each of the through holes in the even column is located between straight lines extending in a second direction orthogonal to the first direction, wherein the straight lines pass through a center of each of the through holes in the odd column.

4. The inspection jig according to claim 3, wherein
a distance between centers of the through holes adjacent to each other in the first direction in each of the odd columns is shorter than a distance between centers of the through holes of the odd columns adjacent to each other in the second direction,
a distance between centers of the through holes adjacent to each other in the first direction in each of the even columns is shorter than a distance between centers of the through holes of the even columns adjacent to each other in the second direction, and
the specific direction is the second direction.

5. The inspection jig according to claim 1, wherein an opening edge portion on the second support portion side of each of the through holes is chamfered.

6. The inspection jig according to claim 1, wherein
a smooth layer for reducing friction is formed on an inner surface of each of the through holes, and
a friction coefficient of the smooth layer with respect to the contact is smaller than a friction coefficient of a base portion of the smooth layer on the facing support plate.

7. The inspection jig according to claim 5, wherein
an opening edge portion on the second support portion side of each of the through holes is a chamfered portion by being chamfered,
a smooth layer for reducing friction is formed on at least one of a through hole main body portion which is a portion excluding the chamfered portion and the chamfered portion on an inner surface including the chamfered portion of each of the through holes, and
a friction coefficient of the smooth layer with respect to the contact is smaller than a friction coefficient of a base portion of the smooth layer on the facing support plate.

8. The inspection jig according to claim 1, wherein
the first support portion includes a support plate located on an opposite side to the second support portion on the facing support plate, and
the facing support plate has a bending strength larger than that of the support plate.

9. The inspection jig according to claim 1, wherein
the first support portion includes a support plate located on an opposite side to the second support portion on the facing support plate,
a plurality of corresponding through holes are formed in the support plate such that a same contact is inserted into a plurality of through holes of the facing support plate,
as to the through holes of the facing support plate and the through hole of the support plate corresponding to each other, a position of the through hole of the facing support plate and a position of the through hole of the support plate are shifted with respect to a perpendicular line of the facing support plate so that the contact is inclined with respect to the perpendicular line, and
a direction of the shift is along the specific direction.

10. The inspection jig according to claim 1, wherein
the plurality of through holes are arranged in a plurality of columns along the specific direction and arranged in a plurality of columns along a third direction intersecting the first direction, and, in a region where the through holes are arranged at equal intervals, number of columns arranged in the specific direction is smaller than number of columns arranged in the third direction.

11. An inspection apparatus comprising:
the inspection jig according to claim 1; and
an inspection processing unit that inspects an inspection object based on an electric signal obtained by bringing the contact into contact with an inspection point provided on the inspection object.

12. An inspection jig comprising:
a plurality of rod-like contacts;
a first support portion that supports a first end portion side of the plurality of contacts; and
a second support portion that supports a second end portion side of the plurality of contacts, wherein
the first support portion includes a facing support plate that is disposed to face the second support portion in a manner separated from the second support portion and has a plurality of through holes through which the plurality of contacts are inserted,
a cross section of each of the through holes has a shape elongated in a predetermined specific direction along a plane direction of the facing support plate, and
an inner wall on one end side in the specific direction of each of the through holes and a contact inserted through each of the through holes are in contact with each other at only two points.

13. The inspection jig according to claim 12, wherein
the plurality of through holes are disposed in a manner divided into an odd column and an even column extending in parallel to each other along a predetermined first direction, and
each of the through holes in the even column passes through a center of each of the through holes in the odd column and is located between straight lines in a second direction orthogonal to the first direction.

14. The inspection jig according to claim 12, wherein an opening edge portion on the second support portion side of each of the through holes is chamfered.

15. The inspection jig according to claim 12, wherein
a smooth layer for reducing friction is formed on an inner surface of each of the through holes, and
a friction coefficient of the smooth layer with respect to the contact is smaller than a friction coefficient of a base portion of the smooth layer on the facing support plate.

16. The inspection jig according to claim 12, wherein
the first support portion includes a support plate located on an opposite side to the second support portion on the facing support plate, and
the facing support plate has a bending strength larger than that of the support plate.

17. The inspection jig according to claim 12, wherein
the first support portion includes a support plate located on an opposite side to the second support portion on the facing support plate,
a plurality of corresponding through holes are formed in the support plate such that a same contact is inserted into a plurality of through holes of the facing support plate,
as to the through holes of the facing support plate and the through hole of the support plate corresponding to each other, a position of the through hole of the facing support plate and a position of the through hole of the support plate are shifted with respect to a perpendicular line of the facing support plate so that the contact is inclined with respect to the perpendicular line, and
a direction of the shift is along the specific direction.

18. The inspection jig according to claim 12, wherein
the plurality of through holes are arranged in a plurality of columns along the specific direction and arranged in a plurality of columns along a third direction intersecting the first direction, and, in a region where the through holes are arranged at equal intervals, number of columns arranged in the specific direction is smaller than number of columns arranged in the third direction.

19. An inspection apparatus comprising:
the inspection jig according to claim 12; and
an inspection processing unit that inspects an inspection object based on an electric signal obtained by bringing the contact into contact with an inspection point provided on the inspection object.

* * * * *